United States Patent
Tomoyasu

(10) Patent No.: US 7,289,866 B2
(45) Date of Patent: Oct. 30, 2007

(54) PLASMA PROCESSING METHOD AND APPARATUS

(75) Inventor: Masayuki Tomoyasu, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 103 days.

(21) Appl. No.: 11/030,049

(22) Filed: Jan. 7, 2005

(65) Prior Publication Data

US 2005/0154482 A1 Jul. 14, 2005

(30) Foreign Application Priority Data

Jan. 8, 2004 (JP) ............................. 2004-002883

(51) Int. Cl.
*G06F 19/00* (2006.01)
*C23F 1/00* (2006.01)
*H01L 21/306* (2006.01)

(52) U.S. Cl. ........................ 700/121; 700/123; 216/67

(58) Field of Classification Search ................ 700/121, 700/123; 216/67

See application file for complete search history.

(56) References Cited

U.S. PATENT DOCUMENTS

| 6,151,532 | A | * | 11/2000 | Barone et al. .............. 700/121 |
| 6,197,116 | B1 | | 3/2001 | Kosugi |
| 6,535,785 | B2 | * | 3/2003 | Johnson et al. ............. 700/121 |
| 6,553,277 | B1 | * | 4/2003 | Yagisawa et al. ........... 700/204 |
| 6,725,121 | B1 | * | 4/2004 | Pasadyn et al. ............. 700/121 |
| 2003/0230551 | A1 | * | 12/2003 | Kagoshima et al. .......... 216/72 |
| 2004/0181299 | A1 | | 9/2004 | Yamazaki et al. |

\* cited by examiner

*Primary Examiner*—Michael D. Masinick
(74) *Attorney, Agent, or Firm*—Oblon, Spivak, McClelland, Maier & Neustadt, P.C.

(57) ABSTRACT

In a plasma processing method for monitoring data, first and second measurement data are obtained; and a first and a second model are formulated based on the first and the second measurement data. Further, third measurement data is obtained; and weight factors are obtained by setting the third measurement data as weighted measurement data wherein the weighted measurement data is obtained by multiplying each of the first and the second measurement data by one of the weight factors to produce first and second weighted data and summing the thus produced first and second weighted data. Therefore, a third model is formulated by multiplying each of the first and the second model by one of the weight factors to produce first and second weighted models, and summing the thus produced first and the second weighted models.

10 Claims, 2 Drawing Sheets

PLASMA PROCESSING METHOD AND APPARATUS

FIELD OF THE INVENTION

The present invention relates to a plasma processing method and apparatus; and more particularly, to a plasma processing method and apparatus for monitoring data obtained during plasma processing, such as detection of abnormality in a processing apparatus, prediction of apparatus status, prediction of object status and the like, when processing an object, e.g., a semiconductor wafer.

BACKGROUND OF THE INVENTION

The semiconductor fabrication process requires various processing apparatuses. For example, in a film forming or an etching processing of an object (e.g., a semiconductor wafer, a glass substrate etc.), a processing apparatus such as a plasma processing apparatus is used widely. In the plasma processing apparatus, a processing gas introduced in a sealed processing chamber is converted into a plasma to perform plasma processing on the surface of an object such as a semiconductor wafer. Thus, reaction by-products and the like produced by the plasma processing deposit on the inner wall surface of the processing chamber during the plasma processing, which is performed continuously, to affect the plasma state. As a result, the plasma state is altered slightly. Since such changes in the plasma state would affect the processing result of wafers from etching, the plasma state changes or the processing results must be monitored to maintain the quality of the processing at all times.

Thus, a test wafer is prepared in advance and an etching processing is regularly performed on the test wafer, so that the processing apparatus status can be checked based on the processing result (e.g., amount of erosion, uniformity or the like of the test wafer).

However, when the processing apparatus status is checked based on a test wafer, a large number of test wafers are needed and then the test wafers must be processed by using the processing apparatus whose processing condition is to be monitored and respective processing results must be measured. The preparation of such a large number of test wafers and the measurement of their processing results have been an issue because this practice entails additional costly labor and time.

Further, there has been proposed a method for monitoring the processing of a plasma processing apparatus, as disclosed in Japanese Patent Application Laid-open No. 10-125660. In this method, a model equation correlating a plasma processing characteristic with an electric signal reflecting the plasma state is generated by using a test wafer before a processing; and the plasma processing characteristic is predicted by substituting in the model equation a detection value of an electric signal obtained when processing an actual wafer.

However, when generating a model equation correlating electric signals with plasma processing characteristics, if the same model is used when the plasma processing is performed under other operation conditions, e.g., different etching conditions, the prediction of results or the detection of abnormality, which is obtained by using the model, becomes unreliable. For example, when a model A is generated by performing the plasma processing under an operating condition A, if the model A is applied to monitor the processing result or the abnormality detection of the plasma state when performing the plasma processing under a different operating condition B, the overall accuracy cannot be trusted. Thus, an optimum model is dependent on specific operating conditions. Consequently, it becomes necessary to generate a model equation by multivariate analysis for each operating conditions. If one model equation generated in one operating condition is applied to another operating condition, the accuracy of the prediction of results or the detection of abnormality may not be sufficiently reliable. In the semiconductor fabrication industry, the model equations must be generated to handle various operating conditions since the trend for small quantity batch production is increasingly dominating the market.

However, if the model is newly generated every time the operating condition is altered, the cost of operation processing required for the model generation would then increase. For example, there is a cost that wet cycle data needs to be collected for several weeks or data collection needs to be conducted numerous times while changing the operating condition by using an orthogonal array produced based on a center condition and then such collected data must be analyzed.

Further, in order to formulate a model to predict processing results on a semiconductor wafer or the like, it is required to obtain measurement data, e.g., sensor data, and to obtain the processing results such as shape, etching rate and the like after the semiconductor wafer needs to be unloaded. In this case, it is also necessary to obtain the sensor data and the processing results of the wafer under numerous conditions by using the orthogonal array and the like. If the model is newly formulated every time the operating conditions are changed, the burden of measurement is also significantly increased.

Still further, the above-described problems are not limited to cases involving electric signals when predicting the plasma processing characteristics, but the same problems are confronted also in case of adopting emission from the plasma; emission absorption by radicals in the plasma; analysis of exhaust gas components in a processing chamber by using quadrupole mass spectrometric method or FT-IR (Fourier Transform-Infrared spectroscopy); and measurement data of a film thickness of a polymer deposited on an inner wall of the processing chamber obtained through the use of acoustic element and the like.

SUMMARY OF THE INVENTION

It is, therefore, an object of the present invention to provide a plasma processing method and apparatus capable of improving accuracy of the detection of abnormality in the plasma processing apparatus, the prediction of apparatus status or the prediction of object status, and at the same time, reducing the cost caused by model generation (e.g., costs of data collection of the processing results on numerous wafers, processing result analysis for long period, or the like).

In accordance with one aspect of the present invention, there is provided a plasma processing method for monitoring information on a plasma processing based on a model or for updating an operating condition of the plasma processing based on a change in the information on the plasma processing caused by the model, when performing the plasma processing on an object by setting the operating condition of a processing apparatus and generating a plasma in an airtight processing vessel provided in the processing apparatus, wherein the model is made by performing a multivariate analysis based on measurement data measured by one or more measuring devices installed at the processing apparatus, the method including the steps of: obtaining first measurement data by using the measuring devices while performing the plasma processing by setting a first operating condition; formulating a first model based on the first measurement data by the multivariate analysis; obtaining second measurement data by using the measuring devices while performing the plasma processing by setting a second operating condition; formulating a second model based on the second measurement data by the multivariate analysis; obtaining third measurement data by using the measuring devices while performing the plasma processing by setting a third operating condition; obtaining weight factors by setting the third measurement data as weighted measurement data wherein the weighted measurement data is obtained by multiplying each of the first and the second measurement data by one of the weight factors to produce first and second weighted data and summing the thus produced first and the second weighted data; and formulating a third model for the third operating condition by multiplying each of the first and the second model by the one of the weight factors to produce first and second weighted models, and summing the thus produced first and the second weighted models.

In accordance with another aspect of the present invention, there is provided a plasma processing apparatus for monitoring information on a plasma processing based on a model or for updating an operating condition of the plasma processing based on a change in the information on the plasma processing caused by the model, when performing the plasma processing on an object by setting the operating condition and generating a plasma in an airtight processing vessel, wherein the model is made by performing a multivariate analysis based on measurement data measured by one or more measuring devices, the apparatus including: a means for storing first measurement data by using the measuring devices while performing the plasma processing by setting a first operating condition; a means for storing a first model formulated by the multivariate analysis based on the first measurement data; a means for storing second measurement data by using the measuring devices while performing the plasma processing by setting a second operating condition; a means for storing a second model formulated by the multivariate analysis based on the second measurement data; a means for storing third measurement data by using the measuring devices while performing the plasma processing by setting a third operating condition; a means for obtaining weight factors by setting the third measurement data as weighted measurement data wherein the weighted measurement data is obtained by multiplying each of the first and the second measurement data by one of the weight factors to produce first and second weighted data and summing the thus produced first and the second data; and a means for formulating a third model for the third operating condition by multiplying each of the first and the second model by the one of the weight factors to produce first and second weighted models, and summing the thus produced first and the second weighted models.

In accordance with the present invention, the third measurement data for the new third operating condition is expressed as weighted measurement data, wherein the weighted measurement data is obtained by multiplying each of the first and the second measurement data by one of the weight factors to produce first and second weighted data, and summing the thus produced first and the second weighted data; and the first through the third measurement data are applied thereto. Therefore, the weighting factors are obtained. Further, the model for the new third operating condition can be readily formulated by multiplying the first and the second model by one of the identical weighting factors, respectively, to produce first and second weighted models, and summing the thus produced first and the second weighted models. For example, the model can be readily formulated based on the new third operating condition by preparing in advance each measurement data and model for the first operating condition as a reference and the second operating condition changing one control parameter from parameters of the first operating condition.

In this way, accuracy of the detection of abnormality in the plasma processing apparatus based on such a model, the prediction of plasma processing apparatus status, the prediction of object status or the like, can be increased, and at the same time, a cost of making the model can be reduced. For example, a cost of collecting data when making the model or a cost of analyzing the processing results and the like can be reduced.

For achieving the object, in accordance with still another aspect of the present invention, there is provided a plasma processing method for monitoring information on a plasma processing based on a model or for updating an operating condition of the plasma processing based on a change in the information on the plasma processing caused by the model, when performing the plasma processing on an object by setting the operating condition of a processing apparatus and generating a plasma in an airtight processing vessel provided in the processing apparatus, wherein the model is formulated by performing a multivariate analysis based on measurement data obtained by one or more measuring devices installed at the processing apparatus, the method including the steps of: obtaining measurement data for each of a plurality of different operating conditions by using the measuring devices, while performing the plasma processing by setting the operating conditions; formulating a model for each of the operating conditions by performing the multivariate analysis based on the measurement data; obtaining new measurement data from the measuring devices while performing the plasma processing by setting a new operating condition; obtaining weight factors by setting the new measurement data as weighted measurement data for the new operating condition wherein the weighted measurement data is obtained by multiplying the measurement data for each of the operating conditions by one of the weight factors to produce weighted measurement data for the operating conditions, and summing the thus produced weighted measurement data; and formulating a new model for the new operating condition by multiplying each of the models by the one of the weight factors to produce weighted models, and summing the produced weighted models.

For achieving the object, in accordance with still another aspect of the present invention, there is provided a plasma processing apparatus for monitoring information on a plasma processing based on a model or for updating an operating condition of the plasma processing based on a change in the information on the plasma processing caused by the model, when performing the plasma processing on an object by setting the operating condition and generating a plasma in an airtight processing vessel, wherein the model is made by performing a multivariate analysis based on measurement data measured by one or more measuring devices, the apparatus including: a means for storing measurement data for each of a plurality of different operating conditions by using the measuring devices while performing the plasma processing by setting the operating conditions; a means for storing a model for each of the operating conditions formulated by performing the multivariate analysis based on the measurement data; a means for storing new measurement data from the measuring devices while performing the plasma processing by setting a new operating condition; a means for obtaining weight factors by setting the new measurement data as weighted measurement data for the new operating condition wherein the weighted measurement data is obtained by multiplying the measurement data for each of the operating conditions by one of the weight factors to produce weighted measurement data for the operating conditions, and summing the thus produced weighted measurement data; and a means for formulating a new model for the new operating condition by multiplying each of the models by the one of the weight factors to produce weighted models, and summing the thus produced weighted models.

In accordance with the present invention, measurement data for each of a plurality of different operating conditions is obtained, and each model is formulated by the multivariate analysis. Further, the measurement data according to the new operating condition is expressed by weighted measurement data by multiplying the measurement data for the different operating conditions by one of the weighting factors to produce weighted measurement data for the operating conditions, and summing the produced weighted measurement data. Therefore, by applying each measurement data thereto, the weighting factors can be obtained. Still further, the model for the new operating condition can be readily formulated by multiplying each of the models obtained in advance by the multivariate analysis by one of the identical weighting factors to produce weighted models, and summing the produced weighted models. As described above, the model for the new operating condition can be generated while not performing the multivariate analysis.

In the aforementioned method and apparatus, it is preferable that each operating condition includes plural parameters; the operating conditions include a reference operating condition and one or more additional operating conditions, a value of only one parameter of each additional operating condition being different from that of the reference operating condition; and values of one or more parameters of the new operating condition are different from those of the reference operating condition, the one or more the parameters being identical to one or more parameters changed in the operating conditions. As described above, the model for the new operating condition is formulated based on the equation wherein each of the models for operating conditions wherein the parameters being identical to those of the new operating condition, which are different from those of the reference operating condition, are changed is obtained by multiplying one of the weighting factors to produce weighted models and summing the weighted models. As a result, a noise due to parameters other than the operating conditions is hardly introduced, so that the accuracy of the prediction performed by using such a model can be increased.

Further, in the aforementioned method and apparatus, the one or more parameters changed in the operating conditions may be one or more parameters selected from the group consisting of a high frequency power supplied to an electrode, installed in the processing vessel, for generating a plasma; an inner pressure of the processing vessel; a flow rate ratio between multiple species of processing gases supplied into the processing vessel for performing the plasma processing; and a pressure of a backside gas supplied to a rear surface of the object for cooling the object. In practice, there are many cases where the plasma processing is performed by changing these control parameters as mentioned above, so that the effect of changing these parameters is large.

Still further, in the aforementioned method and apparatus, the model may be a correlation factor between the measurement data and processing result data by the plasma processing; and the processing results may be predicted based on a correlation equation made by the correlation factor. In this way, the accuracy of the prediction of processing results can be increased, and a cost of making the model of the operating condition for performing the prediction can be reduced. Particularly, it is unnecessary to measure the data for the increase in the condition, and to obtain the data changing the condition by using the orthogonal array as a center, or the data varied for the long period.

Still further, in the aforementioned method and apparatus, the model may be a correlation factor between the measurement data and processing result data by the plasma processing, and it may be determined or predicted whether the plasma processing is abnormal or not based on a correlation equation made by the correlation factor.

Still further, in the aforementioned method and apparatus, the model may be a correlation factor between the measurement data and processing result data by the plasma processing, and it may be estimated why an abnormality in the plasma processing is generated based on a correlation equation made by the correlation factor.

Still further, in the aforementioned method and apparatus, the model may be a correlation factor between the measurement data and processing result data by the plasma processing and a correlation equation made by the correlation factor may be used as reference data for compensating a change in the plasma processing.

Still further, in the aforementioned method and apparatus, the multivariate analysis may be performed by a partial least square method, or a principal component analysis method. By using the partial least square method, the accuracy of the prediction of processing results or reason of the abnormality can be increase; and by using the principal component analysis method, the accuracy of the detection of operation status can be increased. Moreover, in any cases, a cost of making the model of the operating condition for performing the prediction can be reduced.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
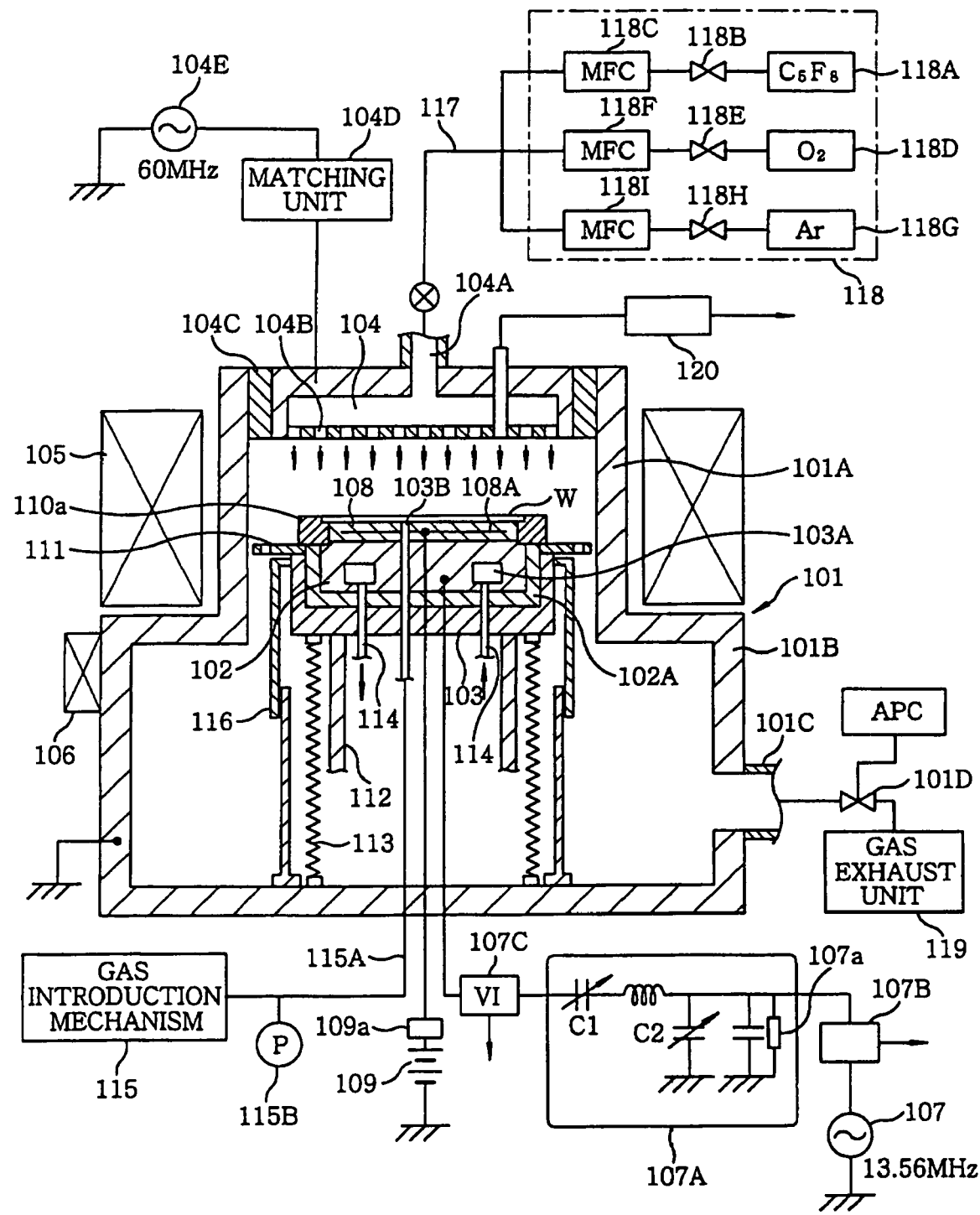
FIG. 1 is a cross sectional view showing a schematic configuration of a plasma processing apparatus in accordance with a preferred embodiment of the present invention.

Hereinafter, preferred embodiments of the present invention will be described in detail with reference to the accompanying drawings. Further, parts having substantially the same functions and configurations as in the specification and drawings are designated by the same reference numerals, and their explanations will be omitted unless necessary.

(Plasma Processing Apparatus)

First, a processing apparatus of the present embodiment, e.g., a magnetron reactive etching processing apparatus (hereinafter, referred to as a plasma processing apparatus 100), will now be described. As shown in FIG. 1, the plasma processing apparatus 100 includes a processing chamber 101 made of aluminum; a vertically movable aluminum supporting body 103 for supporting through an insulating member 102A a lower electrode 102 disposed in the processing chamber 101; and a shower head 104 (hereinafter, referred to as an 'upper electrode' as required), disposed above the supporting body 103 and serving as an upper electrode, for supplying a processing gas. The upper electrode 104 is insulated with the processing chamber 101 through an insulating member 104C.

A first high frequency power supply 104E is connected to the upper electrode 104, and a matching unit 104D is installed in a feeder line thereof. The first high frequency power supply 104E has a frequency in the range from 50 to 150 MHz. By applying such a high frequency power, it is possible to generate a high density plasma in a desired dissociation state inside the processing chamber 101 and to carry out the plasma processing under a lower pressure condition compared to the conventional art. The frequency of the first high frequency power supply 104E is preferably in the range from 50 to 80 MHz, and 60 MHz as described in FIG. 1 or the vicinity thereof is generally adopted.

At the upper electrode 104, there is installed a spectrometer (hereinafter, referred to as "optical measurement device") 120 for detecting a plasma emission inside the processing chamber 101. Emission spectrum intensity of a wavelength detected from the optical measurement device 120 is employed as optical data.

The processing chamber 101 is formed of an upper portion as an upper room 101A having a small diameter; and a lower portion as a lower room 101B having a large diameter. The upper room 101A is surrounded by a dipole ring magnet 105. The dipole ring magnet 105 is accommodated to be disposed in a case wherein multiple anisotropic segment columnar magnets form a ring shaped magnetic material; and it forms a horizontal magnetic field heading for one direction on the whole in the upper room 101A. At an upper part of the lower room 101B, there is installed an entrance for loading or unloading the wafer W; and a gate valve 106 is equipped on this entrance.

A second high frequency power supply 107 is connected to the lower electrode 102 via an electrical measurement device (e.g., VI probe) 107C, a matching unit 107A and a power meter 107B. The second high frequency power supply 107 has a frequency in the range from hundreds of kHz to tens of MHz. By applying a frequency within such a range, it is possible to apply a proper ionic action without causing a damage on the wafer W of an object to be processed. As for the frequency of the second high frequency power supply 107, there is generally adopted 13.56 MHz as described in the drawing, 2 MHz or the like.

In the matching unit 107A, there is provided a measuring device (not shown) for measuring a high frequency (RF) voltage Vpp of a lower electrode 102 side (output side of the high frequency voltage). Specifically, the matching unit 107A has, e.g., two variable capacitors C1 and C2, a capacitor C and a coil L; and it adopts an impedance matching via the variable capacitors C1 and C2.

The matching unit 107A has a power meter 107a through which a voltage Vdc between a feeder line of a second high frequency power and a ground of the plasma processing apparatus 100 is measured.

By using a power meter 107B connected to the lower electrode 102 side (output side of the high frequency power) of the matching unit 107A, a second high frequency power P from the second high frequency power supply 107 is measured. Inside the upper room 101A, a magnetron discharge is generated by an electric field from the high frequency power supply 107 through a processing gas and a horizontal magnetic field by the dipole ring magnet 105; and a plasma of the processing gas supplied into the upper room 101A is produced.

Further, a high frequency voltage V, a high frequency current I, a high frequency phase P and an impedance Z of fundamental wave (a traveling wave and a reflection wave) and higher harmonic wave based on the plasma produced inside the upper room 101A are detected as electric data by the high frequency power P applied to the lower electrode 102 through the electrical measurement device (e.g., VI probe) 107C.

An electrostatic chuck 108 is disposed on a top surface of the lower electrode 102, and a DC power supply 109 is connected to an electrode plate 108A of the electrostatic chuck 108. By using the electrostatic chuck 108, a high voltage from the DC power supply 109 is applied to the electrode plate 108A under high vacuum to thereby electrostatically adsorb the wafer W. A power meter 109a for detecting an applied current and voltage of the electrostatic chuck 108 is disposed between the electrode plate 108A of the electrostatic chuck 108 and the DC power supply 109.

A focus ring 110a is disposed at an outer periphery of the lower electrode 102, and collects a plasma produced inside the upper room 101A on the wafer W. A gas exhaust ring 111 installed above the supporting body 103 is disposed below the focus ring 110a. Multiple holes, through which a gas is discharged from the upper room 101A to the lower room 101B, are formed in a whole circumference of the gas exhaust ring 111 along a circumferential direction while being equispaced.

The supporting body 103 is vertically moved between the upper room 101A and the lower room 101B through a ball screw mechanism 112 and a bellows 113. Thus, in case of providing the wafer W on the lower electrode 102, the lower electrode 102 is lowered to the lower room 101B through the supporting body 103, and the gate valve 106 is opened to provide the wafer W on the lower electrode 102 through a transfer mechanism (not shown).

Inside the supporting body 103, there is formed a coolant path 103A connected to a coolant line 114; and a coolant is circulated in the coolant path 103A through the coolant line 114 to adjust the wafer W to a predetermined temperature.

Gas channels 103B are formed in the supporting body 103, the insulating member 102A, the lower electrode 102 and the electrostatic chuck 108, respectively. For example, an He gas as a backside gas (wafer rear surface gas) having a specified pressure is supplied into a fine gap between the electrostatic chuck 108 and the wafer W through a gas line 115A from a gas introduction mechanism 115; and thermal conductivity between the electrostatic chuck 108 and the wafer W is increased through the He gas. A backside gas pressure (wafer rear surface gas pressure) is detected by a pressure sensor (not shown), and a detection value is displayed in a pressure gauge 115B. Further, reference numeral 116 indicates a bellows cover. Still further, in the gas introduction mechanism 115, there is installed, e.g., a mass flow controller (not shown), by which a flow rate of the backside gas is detected.

On the top surface of the shower head 104, there is formed a gas inlet 104A to which a processing gas supply unit 118 is connected through a line 117. The processing gas supply unit 118 contains a $C_5F_8$ gas supply source 118A, an $O_2$ gas supply source 118D and an Ar gas supply source 108G.

These gas supply sources 118A, 118D and 118G supply the respective gases having specified flow rates into the shower head 104 through valves 118B, 118E and 118H and mass flow controllers 118C, 118F and 118I, respectively; and these gases are adjusted therein as a gaseous mixture having a predetermined mixture ratio. On a bottom surface of the shower head 104, there are uniformly placed over the entire surface multiple holes 104B, through which the gaseous mixture as a processing gas is supplied into the upper room 101 A from the shower head 104.

Further, in FIG. 1, reference numeral 101C indicates a gas exhaust line, and reference numeral 119 corresponds to a gas exhaust unit, connected to the gas exhaust line 101C, including a vacuum pump and the like. At the gas exhaust line 101C, there is installed an APC (Automatic Pressure Controller) valve 101D whose opening ratio is automatically controlled based on a gas pressure inside the processing chamber 101.

(Data Analysis Apparatus)

Figure 2:
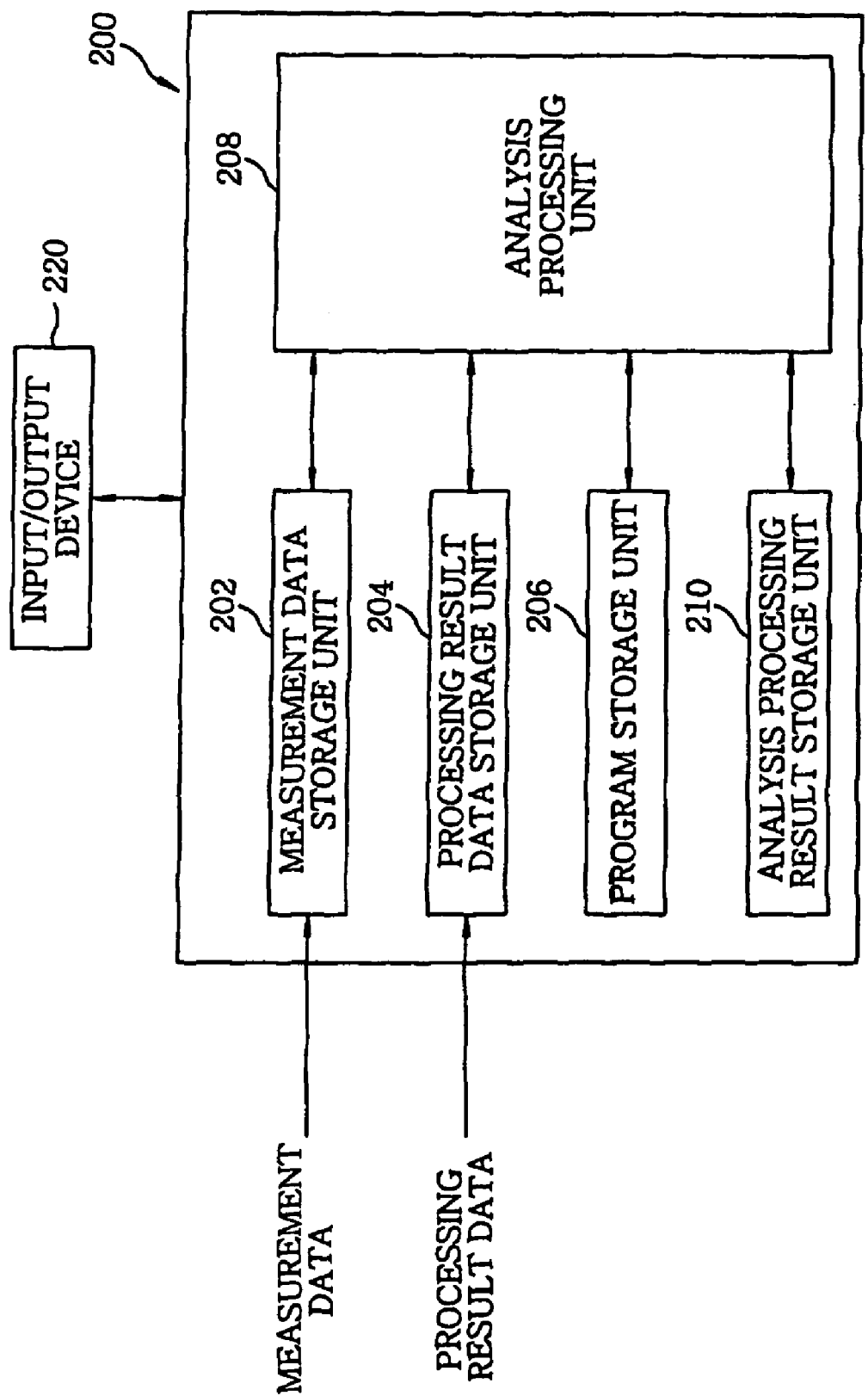
FIG. 2 offers a block diagram showing an exemplary multivariate analysis unit in the preferred embodiment of the present invention.

As shown in FIG. 2, the plasma processing apparatus 100 includes a data analysis apparatus 200 for statistically processing measurement data and processing result data; and an input/output device 220 for inputting the processing result data and outputting information such as analyzed results and the like. In the plasma processing apparatus 100, a correlation between the measurement data and the processing result data is obtained by, e.g., multivariate analysis through the data analysis apparatus 200, and then, the information such as the analysis results and the like are outputted from the input/output device 220, if necessary.

The data analysis apparatus 200 contains a measurement data storage unit 202; a processing result data storage unit 204; a program storage unit 206; an analysis processing unit 208; and an analysis processing result storage unit 210.

The measurement data storage unit 202 contains a means for storing measurement data; and the processing result data storage unit 204 contains a means for storing processing result data. The analysis processing unit 208 contains a means for obtaining a correlation (containing a prediction equation and a regression equation) between the measurement data and the processing result data and a means for predicting processing results based on the correlation. The analysis processing result storage unit 210 contains a means for storing the correlation (e.g., a model K by a regression equation 1 using following PSL method) obtained by the analysis processing unit 208.

The program storage unit 206 stores, e.g., a multivariate analysis program, a program for producing a model by, e.g., a linear equation that will be discussed later, or the like. The data analysis apparatus 200 is configured to analyze data based on the program of the program storage unit 206.

The data analysis apparatus 200 may be formed of a microprocessor and the like, which operate based on the program of the program storage unit 206. The above-described measurement data storage unit 202, processing result data storage unit 204 and analysis processing result storage unit 210 may be of a recording unit such as a memory or the like, respectively, or may be formed by providing respective memory areas in a storage unit such as a hard disk or the like.

In the data analysis apparatus 200, if the measurement data and the processing result data are inputted to be stored in the measurement data storage unit 202 and the processing result data storage unit 204, respectively, the analysis processing unit 208 performs multivariate analysis on the measurement data and the process characteristic data by taking out the respective data of the measurement data storage unit 202 and the processing result data storage unit 204 and the multivariate analysis program of the program storage unit 206, and thus the processing results thereof are stored in the analysis processing result storage unit 210.

The term "the measurement data" used herein means sensor data obtained from each of the multiple measuring devices installed in the plasma processing apparatus 100 during the wafer W processing; and the term "the processing result data" means process characteristic data related to the wafer W, which is obtained as a result of the wafer W processing, and apparatus status data related to the processing chamber 101 status. The measurement data is intermittently measured during the wafer W processing, and the processing result data is measured as required after the wafer processing by a measuring device installed in the plasma processing apparatus 100, or by an external measuring device separated from the plasma processing apparatus 100. The processing result data measured by the external measuring device may be directly transferred to the plasma processing apparatus 100 via, e.g., network, or EES (Equipment Engineering System). In this case, the data from the external measuring device may be transferred to the plasma processing apparatus 100 in a specified format, e.g., CVS (Comma Separated Value) format, XML (extensible Markup Language) format or the like. These measurement results are stored in the storage units 202 and 204, respectively.

As for the measurement data, it is preferable to use data easily affecting the processing results since the present embodiment is configured to obtain a correlation between the measurement data and the processing result data.

In the present embodiment, optical data and VI probe data are employed as the measurement data. As for the optical data, there is used an emission spectrum intensity of a wavelength, which is detected from the aforementioned optical measurement device 120. Moreover, as for the VI probe data, there are employed a high frequency voltage V, a high frequency current I, a high frequency phase P, an impedance Z and the like of the high frequency wave, e.g., in the electrical measurement device (VI probe) 107C.

Further, as for the process characteristic data of the processing result data, there are utilized, e.g., etching data such as a predetermined dimension of a shape formed by performing an etching processing on the wafer W, and the like. In the present embodiment, a CD shift of a hole formed by the etching processing is employed as the processing result data. For example, a mask layer is formed on a silicon dioxide film (e.g., $SiO_2$ film) formed on the wafer, and a specific etching processing is performed to form a hole in the silicon dioxide film. After performing the etching processing, a diameter of a bottom portion of the hole is measured; and a difference between a measurement value and a target value (design value) is given as a CD shift. The CD shift is obtained after performing the etching processing on each wafer, and stored as processing result data in the processing result data storage unit 204.

In the data analysis apparatus 200 of the present embodiment, a model equation (correlation equation) obtained by using a multivariate analysis program, wherein many kinds of measurement data are expressed as independent (or explanatory) variates (independent variables) and the process characteristic data are expressed as dependent variates (dependent variables), can be described as:

$$Y = KX \qquad \text{Eq. 1.}$$

Herein, X means a matrix of explanatory variables, and Y means a matrix of explained variables. Moreover, K corresponds to a regression matrix formed of factors of explanatory variables. The regression matrix K (hereinafter, also referred to as a model) corresponds to a factor showing a relationship between the explanatory variables X and the unexplained variable Y.

In the present embodiment, there is employed, e.g., PLS (Partial Least Squares) method disclosed in JOURNAL OF CHEMOMETRICS, VOL. 2 (PP211-228) (1998) when obtaining the equation 1. In case of PLS method, if a small number of actual measurement values with respect to the respective matrixes X and Y are present, the model equation 1 of X and Y can be obtained, even though there are many explanatory variables and unexplained variables in the respective matrixes X and Y. Furthermore, even in case of the model equation 1 obtained by a small number of actual measurement values, stability and reliability can be increased by using PLS method.

In the program storage unit 206, a program for PLS method is stored; the measurement data and the process characteristic data are processed in the analysis processing unit 208 based on an order of the program; and the model equation 1 is obtained and the result thereof is stored in the analysis processing result storage unit 210. Accordingly, in the present embodiment, if the model equation 1 is obtained, the process characteristic can be predicted by applying the measurement data as explanatory variables to the matrix X. Further, the reliability of the prediction value can be increased.

For example, an $i^{th}$ main component corresponding to an $i^{th}$ eigenvalue with respect to $X^TY$ matrix is indicated by $t_i$. The matrix X can be described in following equation 2 by using a score $t_i$ and a vector $p_i$ of the $i^{th}$ main component, and the matrix Y can be described in following equation 3 by using a score $t_i$ and a vector $c_i$ of the $i^{th}$ main component:

$$X = t_1 p_1 + t_2 p_2 + t_3 p_3 + \ldots + t_i p_i + X_{i+1} \quad \text{Eq. 2,}$$

and $$Y = t_1 c_1 + t_2 c_2 + t_3 c_3 + \ldots + t_i c_i + Y_{i+1} \quad \text{Eq. 3.}$$

In the equations 2 and 3, $X_{i+1}$ and $Y_{i+1}$ are residual matrixes of X and Y, and $X^T$ is a transposed matrix of X. Hereinafter, component T means a transposed matrix.

Further, PLS method used in the embodiment is effective in obtaining multiple eigenvalues and respective eigenvectors by a small number of calculations in case where the equations 2 and 3 are related to each other.

PLS method is performed in the following manner. In the first step, centering and scaling operations of the matrixes X and Y are performed. Then, it is given that i=1, $X_1=X$ and $Y_1=Y$. Moreover, a first row of the matrix Y1 is set as U1. The term "centering" refers to an operation for subtracting the mean value of each line from each value of each line; and the term "scaling" refers to an operation (processing) for dividing each value of each line into the standard deviation thereof.

In the second step, the equation "$w_i = X_i^T u_i / (u_i^T u_i)$" is obtained; a matrix equation of $w_i$ is normalized; and $t_i = X_i w_i$ is obtained. Further, the matrix Y is processed in the same manner to obtain the equation "$c_i = Y_i^T t_i / (t_i^T t_i)$". Then, a matrix of $c_i$ is normalized and the equation "$u_i = Y_i c_i / (c_i^T c_i)$ is obtained.

In the third step, X loading "$p_i = X_i^T t_i / (t_i^T t_i)$" and Y loading "$q_i = Y_i^T u_i / (u_i^T u_i)$" are obtained. Further, the equation "$bi = u_i^T t_i / (t_i^T t_i)$", wherein u is regressed into t, is obtained. Subsequently, the residual matrixes "$X_i = X_i - t_i p_i^T$" and "$Y_i = Y_i - b_i t_i c_i^T$" are obtained. Further, i=i+1 is set by i increment, and the processings are repeated from the second step. Such a series of processings are performed based on the program of PLS method until a predetermined stop condition is satisfied, or until the residual matrix $X_{i+1}$ converges into zero, and thus the maximum eigenvalue of the residual matrix and an eigenvector thereof are obtained.

In PLS method, stop condition or convergence into zero of the residual matrix $X_{i+1}$ is rapidly obtained, so that the residual matrix can converge into the stop condition or zero by performing only about ten times of calculations. Generally, if the calculations are repeated four or five times, the residual matrix converges into the stop condition or zero. A first main component of a $X^TY$ matrix is obtained by using the maximum eigenvalue obtained by such calculation processings and the eigenvector thereof, so that the maximum relationship between the X matrix and the Y matrix can be noted.

If the model equation 1 is obtained by such PLS method, measurement data measured in case when the plasma processing is performed under new operating condition are applied to the matrix X as explanatory variables, to thereby predict the process characteristic. In this case, the model equation 1 is obtained by changing the condition such as 9 conditions or 18 conditions by orthogonal arrays using conventional operating condition as a center, and by substituting the measurement data and the process characteristic data in the aforementioned manner.

However, if the same model equation 1 is used for the plasma processing under other operating conditions (e.g., other etching conditions), accuracy of the prediction of results or the detection of abnormality, which is obtained by using the equation 1, may be declined. Particularly, the accuracy of prediction and the like would drop, as a variation resulting from the change of the operating condition gets larger. It means that the optimum model equation depends on the operating conditions.

Accordingly, for increasing the accuracy of the prediction of results or the detection of abnormality, the model equation needs to be generated again by performing multivariate analysis for each operating conditions. If one model equation is applied as a model equation for another operating condition, the accuracy of the prediction of results or the detection of abnormality may be lacking.

However, for predicting the processing results on the semiconductor wafer or the like, it is necessary to obtain measurement data by unloading the semiconductor wafer after performing the plasma processing and by measuring the processing results such as shape and etching rate, with respect to the several conditions for the model making based on the orthogonal arrays. Moreover, if the model is generated every time the operating condition is altered, the cost for an operation processing required for the model formulation is increased and the cost for the measurement as described above is also increased.

Therefore, in the present invention, a simple equation is formulated from a plurality of models, which have been obtained by the minimum data measurement in advance under designed operating conditions, instead of performing new multivariate analysis on new operating conditions; and a new model is approximated by the equation. A method for formulating such a new mode will be discussed later in detail. In this way, the cost associated with generating models (e.g., costs for data collection or costs for the operation processing when making the models, costs for analysis or measurement of the processing result, or the like) can be reduced.

(Principle of Formulating New Models in the Present Invention)

Next, the principle of formulating a model when performing a plasma processing under new operating conditions in the present invention will be explained. As for the control parameters of the operating condition, they include: a high frequency power to the lower electrode 102; an inner pressure of the processing chamber 101; a flow rate ratio of the processing gas and the like, as mentioned above. If the plasma processing is performed by changing the control parameters of the operating conditions, the measurement data measured by the respective measuring devices are accordingly changed. When any one control parameter of the operating condition were to be examined, if the control parameter is slightly changed, the measurement data is accordingly changed slightly. Thus, if the plasma processing is performed by changing one control parameter of the operating condition into several values, each measurement data obtained by each plasma processing has an approximately linear relationship.

Therefore, a reference operating condition A is given as a first operating condition; and an operating condition B changing, e.g., one control parameter of the operating condition A is given as a second operating condition. Further, as a third operating condition, there is given new operating condition P changing, e.g., the same control parameter as above. Then, the plasma processing is performed in advance under the operating condition A to obtain measurement data Xa as a first measurement data; and it is performed in advance under the operating condition B to obtain measurement data Xb as a second measurement data. Measurement data Xp can be obtained as following equation 4 by performing the plasma processing under the new operating condition P as weighted measurement data, wherein the measurement data Xa and Xb are multiplied by weight factors Wa and Wb, respectively, and multiplied respective values are added to each other:

$$Xp = WaXa + WbXb \quad \text{Eq. 4.}$$

At this time, the data measurement for obtaining the weight factors Wa and Wb is sufficient only with the measurement data of the operating condition P, so that it is unnecessary to obtain the data under a condition changed by the orthogonal array and the like. Further, the process characteristic data need not to be measured.

Therefore, if the measurement data Xp is obtained by performing the plasma processing under the new operating condition P, the weight factors Wa and Wb can be obtained by the equation 4 since the respective measurement data Xa and Xb have been known already. In this way, a linear relation equation between the measurement data can be obtained.

Meanwhile, according to, e.g., PLS method, there is a relationship between objective variables Y and explanatory variables X, as shown in the model equation 1. If the measurement data X is changed, the model K of the model equation 1 is accordingly changed. The change of the measurement data X depends on that of the operating condition. Thus, in case where the plasma processing is performed by changing one control parameter of the operating condition into several values, the model K obtained by each plasma processing can be considered to have an approximately linear relationship. Moreover, the weight factors between the measurement data may be used as weight factors in the respective models K, referring to the model equation 1.

Therefore, as described above, a first model Ka and a second model Kb are obtained by performing multivariate analysis from the measurement data Xa and Xb, which have been obtained by carrying out the plasma processings under the reference operating condition A and the operating condition B changing one control parameter of the operating condition A. In case where the plasma processing is performed by changing the same control parameter as the new operating condition P, a third model Kp can be described as following equation 5 by multiplying the first measurement data Ka and the second measurement data Kb by the same weight factors Wa and Wb as in the equation 4, respectively:

$$Kp = WaKa + WbKb \quad \text{Eq. 5.}$$

Therefore, the weight factors Wa and Wb are obtained by the equation 4, and the third model Kp can be readily obtained by applying Ka and Kb to the equation 5 since they are known values, while not performing new multivariate analysis.

While there has been explained above a case of changing one control parameter of the operating condition, a case of changing multiple control parameters of the operating condition may be considered in the same manner. Namely, the measurement data Xp based on the new operating condition P can be expressed as weighted measurement data obtained by using the equation wherein measurement data for an operating condition group are multiplied by weight factors, respectively, and multiplied values are added to each other. Here, in the operating condition group, the identical number of control parameters to that of the multiple control parameters in the new operation condition P changed from the reference operating condition A is changed individually. Further, the model Kp based on the new operating condition P can be expressed by the equation wherein the models by the above-described operating conditions are multiplied by the same weight factors as above, respectively, and multiplied values are added to each other.

For example, in case where multiple control parameters of the new operating condition P are changed from those of the reference operating condition A and Xa~Xn denote measurement data obtained from the reference operating condition A and operating conditions in each of which one of the multiple control parameters is changed from that of the reference operation condition A, the measurement data Xp and the model Kp for the new operating condition P can be described as:

$$Xp = WaXa + WbXb + \ldots + WnXn \quad \text{Eq. 6,}$$

and $$Kp = WaKa + WbKb + \ldots + WnKn \quad \text{Eq. 7.}$$

Herein, subscripts represent operating conditions. For example, Xa, Xb, . . . Xn and Xp indicate measurement data when performing the etching processing under the operating conditions A, B, . . . N and P, respectively. The measurement data X and the weight factor W can be expressed as described in equations 8 and 9 by, e.g., diagonal matrixes:

$$X = \begin{bmatrix} x_1 & 0 & \cdot & \cdot & 0 \\ 0 & x_2 & \cdot & \cdot & \cdot \\ \cdot & \cdot & \cdot & \cdot & \cdot \\ \cdot & \cdot & \cdot & \cdot & 0 \\ 0 & \cdot & \cdot & 0 & x_n \end{bmatrix}, \text{ and} \quad \text{Eq. 8}$$

-continued $$W = \begin{bmatrix} w_1 & 0 & \cdot & \cdot & 0 \\ 0 & w_2 & \cdot & \cdot & \cdot \\ \cdot & \cdot & \cdot & \cdot & \cdot \\ \cdot & \cdot & \cdot & \cdot & 0 \\ 0 & \cdot & \cdot & 0 & w_n \end{bmatrix}$$ Eq. 9

Further, the regression matrix K can be expressed by m×n matrix as described in the following equation 10:

$$K = \begin{bmatrix} k_{11} & k_{21} & \cdot & \cdot & k_{m1} \\ k_{12} & k_{22} & \cdot & \cdot & k_{m2} \\ \cdot & \cdot & \cdot & \cdot & \cdot \\ \cdot & \cdot & \cdot & \cdot & \cdot \\ k_{1n} & k_{2n} & \cdot & \cdot & k_{mn} \end{bmatrix}$$ Eq. 10

Herein, m is the number of sensor data, and n is the number of operating conditions.

As described above, even in case where multiple control parameters of the operating condition are changed, the measurement data Xp by the new operating condition P can be expressed by the equation like the above-described equation 6, and the model Kp can be expressed by the equation like the above-described equation 7. Therefore, the model Kp can be readily obtained by obtaining the weight factors Wa~Wn by the equation 6 and applying the weight factors Wa~Wn to equation 7, while not performing multivariate analysis.

Namely, the new model Kp can be readily obtained based on the equations 6 and 7 by preparing in advance as the new operating conditions the respective measurement data by the respective operating conditions changing the same control parameters as the control parameters to be changed in the reference operating condition; and the respective models made by multivariate analysis.

Further, it may be preferable to make models in advance for operating conditions differing in at least one of the control parameters including a high frequency power to the lower electrode; an inner pressure of the processing chamber; a flow rate ratio between many kinds of processing gases, supplied into the processing vessel, for performing a plasma processing; and a pressure of a backside gas, supplied to a rear surface of an object, for cooling the object. It is because in practice there are many cases where the plasma processing is performed under the operating condition changing these control parameters.

Still further, the number of operating conditions n is, e.g., about 3~6. In this way, operating conditions of, e.g., n=about 20~50, can be predicted from the models based on data of the operating condition of n=about 6.

Still further, it may be preferable to introduce a range within which each control parameter of the operating condition for making the model in advance is changed. In other words, it is preferable to estimate the maximum range where the control parameter can be changed when performing an etching processing and then to assign the control parameter within such a range.

(Operation of the Processing Apparatus)

In the following, an operation of the plasma processing apparatus 100 will be explained. A specific operating condition is set to perform a plasma processing by the plasma processing apparatus 100. As for the plasma processing, there are two cases: one case where it is performed by setting operating conditions A~N for obtaining a model in advance by multivariate analysis; and the other case where it is performed by setting new operating condition P to be predicted.

If the operation of the plasma processing apparatus 100 is started, the supporting body 103 is lowered to the lower room 101B of the processing chamber 101 through the ball screw mechanism 112. At the same time, the wafer W is loaded from the entrance and mounted on the lower electrode 102 by opening the gate valve 106. After loading the wafer W, the gate valve 106 is closed, and the gas exhaust unit 119 is operated to maintain the inside of the processing chamber 101 at a predetermined vacuum level. At this time, an He gas as a back gas having a specified pressure is supplied from the gas introduction mechanism 115 to increase thermal conductivity between the wafer W and the lower electrode 102, specifically between the electrostatic chuck 108 and the wafer W, to thereby increase cooling efficiency of the wafer W. Further, temperatures of the upper electrode 104, lower electrode 102 and the sidewall are set at specified temperatures, respectively.

Meanwhile, the processing gas is supplied from the processing gas supply unit 118. For example, $C_5F_8$ gas, $O_2$ gas and Ar gas are supplied at predetermined flow rates, respectively. At this time, the inner pressure of the processing chamber 101 is set at a predetermined pressure. In that stage, specified high frequency powers are applied to the electrodes (the upper electrode 104 and the lower electrode 102), respectively. In this way, a magnetron discharge is generated with an operation of the dipole ring magnet 105 and the plasma of the processing gas is produced, and thus, e.g., the oxide film of the wafer W is etched. After the etching is terminated, as an operation in contrast with that performed when loading the wafer, a processed wafer W is unloaded from the processing chamber 101, and the same processings are repeatedly performed on a following wafer W. If the specified number of wafers is performed, a series of processings are terminated. With respect to training wafers used when making the model in advance by multivariate analysis, CD shifts of the respective wafers W are obtained and given as processing result data.

In case where the plasma processing is performed by the reference operating condition A, the control parameters of the operating condition A are as follows: an inner pressure of the processing chamber 101 is 4.7 Pa; a high frequency power applied to the upper electrode 104 is 2800 W at 60 MHz frequency; a high frequency power applied to the lower electrode 102 is 3660 W at 13.56 MHz frequency; and flow rates of $C_5F_8$ gas, $O_2$ gas and Ar gas are 12 sccm, 20 sccm and 1300 sccm, respectively. As other control parameters of the reference operating condition A, a pressure of the back gas is 13.3 hPa as a center pressure, or it is 59.9 hPa as an edge pressure; a temperature of the upper electrode 104 is 60° C.; a temperature of the lower electrode 102 is 40° C.; and a temperature of the sidewall is 60° C.

(Method for Monitoring Information on the Plasma Processing)

In the following, a method for monitoring information on the plasma processing of an actual wafer by using the measurement data and the processing result data obtained by the aforementioned plasma processing will be described. In the present embodiment, e.g., a case of predicting and monitoring the processing results when performing the plasma processing under certain operating condition will be explained as for the information on the plasma processing. For example, in case of performing the prediction of the processing results when performing the plasma processing under the operating condition P, it is necessary to obtain the model Kp by the operating condition P.

Accordingly, a method for obtaining the model Kp by the operating condition P will now be described first. In the present embodiment, the model Kp is obtained while not performing new multivariate analysis. Here, it is given as the operating condition P that three control parameters of a high frequency power applied to an electrode (lower or upper electrode), an inner pressure of the processing chamber and a flow rate of the processing gas are changed for the operating condition A when using it as a reference. Given that Xa, Xb, Xc and Xd are measurement data by the operating conditions A, B, C and D changing the respective control parameters and Ka, Kb, Kc and Kd are models, the weight factors We~Wn in the equations 6 and 7 correspond to zero. Therefore, Xp can be expressed as:

$$Xp = WaXa + WbXb + WcXc + WdXd \qquad \text{Eq. 11,}$$

and $$Kp = WaKa + WbKb + WcKc + WdKd \qquad \text{Eq. 12.}$$

Accordingly, the models Ka, Kb, Kc and Kd are obtained by multivariate analysis. In case of obtaining the model Ka by the operating condition A, the operating condition A is set to operate the plasma processing apparatus 100; the plasma processing is performed on the training wafer; and measurement data Xa and processing result data Ya are obtained and stored in the measurement data storage unit 202 and the processing result data storage unit 204, respectively. Then, in the analysis processing unit 208, the model Ka is obtained by performing multivariate analysis according to PLS method using the measurement data Xa as explanatory variables and the processing result data Ya as objective variables; and it is stored in the analysis processing result storage unit 210. Further, the measurement data may be obtained by processing one training wafer for each operating condition, or multiple training wafers can be processed for each operating condition to obtain a mean value therefrom as the measurement data.

Further, for the operating conditions B, C and D same as in the operation A, the plasma processings are performed on the training wafers in the plasma processing apparatus 100 under multiple conditions determined by using, e.g., orthogonal arrays and the like; the measurement data Xb~Xd and the processing result data Yb~Yd are obtained; and the models Kb~Kd are obtained by PLS method to be stored in the analysis processing result storage unit 210.

In case when actually predicting the processing results, the operating condition P is set to perform the plasma processing on a test wafer by the plasma processing apparatus 100 only under the operating condition P; and the measurement data Xp is obtained and stored in the measurement data storage unit 202.

Subsequently, in the analysis processing unit 208, the weight factors Wa~Wd are obtained by applying to the equation 11 the measurement data Xp by the operating condition P and the measurement data Xa~Xd obtained by the respective operating conditions A, B, C and D. Then, the model Kp is obtained by applying to the equation 12 obtained weight factors Wa~Wd and the respective models Ka~Kd obtained by the respective operating conditions A~D.

In this way, a model equation by the operating condition P is obtained as described in equation 13, by applying to the aforementioned model equation 1:

$$Yp = KpXp \qquad \text{Eq. 13.}$$

A prediction value of the processing result data Yp can be obtained only by applying the measurement data Xp by the operating condition P to the model equation 13.

By such a method, other models by other new operating conditions are continuously obtained, processing results thereof are predicted, and these prediction values are monitored. For example, if the difference between the prediction value and the design value is outside the permissible range, it is determined to be abnormal and notified by a notification unit or the like. Further, the operating condition of the plasma processing may be changed depending on the change of the information on the plasma processing by the model. For example, for compensating the change of the prediction value, it can be configured such that the operating condition is changed by additionally set algorithm and the plasma processing result is controlled within the permissible range all the time.

Further, in the above-described example, the new operating condition P means that three control parameters are changed. However, in case of making the model for the operating condition changing two control parameters, the measurement data for the respective control parameters and the equation may be prepared based on the model. For example, if new operating condition is that the inner pressure of the processing chamber and the high frequency power applied to the electrode in the reference operating condition A out of the control parameters are changed, the model is expressed as the equation according to the reference operating condition A and the operating conditions B and C changing only corresponding control parameters. Specifically, weight factors other than the weight factors Wa, Wb and Wc of the operating conditions A, B and C corresponding to the equations 6 and 7 may be zero.

As described above, in accordance with the present embodiment, the model Kp by the operating condition P can be readily obtained in case when actually predicting the processing results of the wafer, while not performing multivariate analysis. In this way, accuracy of the detection of abnormality in the processing apparatus, the prediction of apparatus status, the prediction of object status or the like, can be increased, and at the same time, a cost of an operation processing required for the model making or a cost of measuring the processing results can be reduced.

Further, in case where the control parameters of the reference operating condition A are hardly changed in the new operating condition P for predicting the processing results, the model Kp by the new operating condition P for the reference operating condition A may be the model Ka. For example, in the control parameters of the new operating condition P for predicting the processing results, if the variations of the control parameters of the reference operating condition A are within ±30%, the model Kp by the new operating condition P may be the model Ka.

Still further, in accordance with the present invention, a correlation equation is made by using as a model correlation factors of the measurement data and the processing result data by the plasma processing; and it can be determined or predicted whether the plasma processing is abnormal or not based on the correlation equation made by the correlation factors. Moreover, based on the correlation equation, it can be assumed why the abnormality in the plasma processing is generated. In addition, the correlation equation may be used as reference data for compensating the change of the plasma processing.

Still further, in the present embodiment, making the model equation by using PLS method as multivariate analysis has been explained, but not limited thereto. The model equation may be made by using principal component analysis method as multivariate analysis. According to PLS method, the abnormality in the processing apparatus can be predicted or the cause thereof can be estimated by monitoring the information on the plasma processing. On the other hand, according to the principal component analysis method, it can be determined whether the processing apparatus is abnormal or not by monitoring the information on the plasma processing.

Still further, in the present embodiment, the optical data and the VI probe data have been employed as the measurement data, but trace data may be used. As for the trace data, there are enumerated, e.g., gas flow rates measured by the respective mass flow controllers 118C, 118F and 118I; an APC opening ratio by the APC valve 101D; an application current of the electrostatic chuck 108 detected from the power meter 109a; application voltage data; a gas pressure of a backside gas detected by the pressure gauge 115B; a measurement value in the matching unit 107A (e.g., capacitances of the variable capacitors C1 and C2 in the matching state, and a voltage Vdc between the high frequency power supply line and a ground); and a measurement value(e.g., the high frequency powers of traveling wave and reflection wave etc.) in the electrical measurement device (VI probe) 107C.

Still further, in the present embodiment, a processed dimension of an object such as a dimension of a shape formed by, e.g., an etching processing, has been used as the processing result data. In this way, the processed dimension, for which measurement would demand additional workforce and more time therefor, can be predicted with high accuracy, so that monitoring the processed dimension can be readily conducted. Moreover, processed dimensions of total objects can be predicted with high accuracy, so that they can be properly monitored.

Meanwhile, as for the processing result data, an etching rate by the etching processing may be used, or a film thickness of byproduct inside the processing chamber and apparatus status data related to the apparatus status such as component wastage of the focus ring 110a or the like, may be used. By employing as the apparatus status data the film thickness of byproduct and component wastage of the focus ring 110a, the cleaning cycle of the plasma processing apparatus 100 or the replacement cycle of the components such as the focus ring 110a and the like can be predicted.

Further, the case of performing the etching processing on the wafer W has been explained, but the present invention may be applied to a processing apparatus for the film formation processing other than the etching processing. Still further, it is not limited to the wafer of the object.

Still further, the plasma processing apparatus 100 is not limited to a parallel flat plate type plasma etching apparatus, but may be a helicon wave plasma etching apparatus producing a plasma in the processing chamber, an inductively coupled plasma etching apparatus or the like. Moreover, in the aforementioned embodiment, applying the plasma processing apparatus using the dipole ring magnet to the present invention has been discussed, but it is not limited thereto. For example, the present invention may be applied to the plasma processing apparatus producing a plasma by applying high frequency powers to the upper and the lower electrode without using the dipole ring magnet.

In accordance with the present invention, the accuracy of the detection of abnormality in the processing apparatus, the prediction of the apparatus status or the prediction of the object status can be increased. Therefore, it is possible to monitor information on the plasma processing; to prevent the production yield from being lowered; and to thereby improve the productivity. Further, a cost of making the model can be reduced.

While the invention has been shown and described with respect to the preferred embodiments, it will be understood by those skilled in the art that various changes and modifications may be made without departing from the spirit and scope of the invention as defined in the following claims.

What is claimed is:

1. A plasma processing apparatus for monitoring information on a plasma processing based on a model or for updating an operating condition of the plasma processing based on a change in the information on the plasma processing caused by the model, when performing the plasma processing on an object by setting the operating condition and generating a plasma in an airtight processing vessel, wherein the model is made by performing a multivariate analysis based on measurement data measured by one or more measuring devices, the apparatus comprising:

a means for obtaining first measurement data by using the measuring devices while performing the plasma processing by setting a first operating condition;

a means for formulating a first model based on the first measurement data by the multivariate analysis;

a means for obtaining second measurement data by using the measuring devices while performing the plasma processing by setting a second operating condition;

a means for formulating a second model based on the second measurement data by the multivariate analysis;

a means for obtaining third measurement data by using the measuring devices while performing the plasma processing by setting a third operating condition;

a means for obtaining weight factors by setting the third measurement data as weighted measurement data wherein the weighted measurement data is obtained by multiplying each of the first and the second measurement data by one of the weight factors to produce first and second weighted data and summing the thus produced first and the second weighted data; and a means for formulating a third model for the third operating condition by multiplying each of the first and the second model by said one of the weight factors to produce first and second weighted models, and summing the thus produced first and the second weighted models.

2. A plasma processing apparatus for monitoring information on a plasma processing based on a model or for updating an operating condition of the plasma processing based on a change in the information on the plasma processing caused by the model, when performing the plasma processing on an object by setting the operating condition and generating a plasma in an airtight processing vessel, wherein the model is made by performing a multivariate analysis based on measurement data measured by one or more measuring devices, the apparatus comprising:

a means for obtaining measurement data for each of a plurality of different operating conditions by using the measuring devices while performing the plasma processing by setting the operating conditions;

a means for formulating a model for each of the operating conditions based on the measurement data by performing the multivariate analysis;

a means for obtaining new measurement data from the measuring devices while performing the plasma processing by setting a new operating condition;

a means for obtaining weight factors by setting the new measurement data as weighted measurement data for the new operating condition wherein the weighted measurement data is obtained by multiplying the measurement data for each of the operating conditions by one of the weight factors to produce weighted measurement data for the operating conditions, and summing the thus produced weighted measurement data; and a means for formulating a new model for the new operating condition by multiplying each of the models by said one of the weight factors to produce weighted models, and summing the thus produced weighted models.

3. The plasma processing apparatus of claim 2, wherein each operating condition includes plural parameters;

the operating conditions include a reference operating condition and one or more additional operating conditions, a value of only one parameter of each additional operating condition being different from that of the reference operating condition; and values of one or more parameters of the new operating condition are different from those of the reference operating condition, said one or more parameters being identical to one or more parameters changed in the operating conditions.

4. The plasma processing apparatus of claim 3, wherein said one or more parameters changed in the operating conditions are one or more parameters selected from the group consisting of a high frequency power supplied to an electrode, installed in the processing vessel, for generating a plasma; an inner pressure of the processing vessel; a flow rate ratio between multiple species of processing gases supplied into the processing vessel for performing the plasma processing; and a pressure of a backside gas supplied to a rear surface of the object for cooling the object.

5. The plasma processing apparatus of claim 2, wherein the model is a correlation factor between the measurement data and processing result data by the plasma processing; and the processing results are predicted based on a correlation equation made by the correlation factor.

6. The plasma processing apparatus of claim 2, wherein the model is a correlation factor between the measurement data and processing result data by the plasma processing; and it is determined or predicted whether the plasma processing is abnormal or not based on a correlation equation made by the correlation factor.

7. The plasma processing apparatus of claim 2, wherein the model is a correlation factor between the measurement data and processing result data by the plasma processing; and it is estimated why an abnormality in the plasma processing is generated based on a correlation equation made by the correlation factor.

8. The plasma processing apparatus of claim 2, wherein the model is a correlation factor between the measurement data and processing result data by the plasma processing and a correlation equation made by the correlation factor is used as reference data for compensating a change of the plasma processing.

9. The plasma processing apparatus of claim 2, wherein the multivariate analysis is performed by a partial least square method.

10. The plasma processing apparatus of claim 2, wherein the multivariate analysis is performed by a principal component analysis method.

* * * * *